United States Patent
Kise et al.

(10) Patent No.: US 9,841,464 B2
(45) Date of Patent: Dec. 12, 2017

(54) LIFE PREDICTION APPARATUS FOR ELECTRICAL STORAGE DEVICE AND LIFE PREDICTION METHOD FOR ELECTRICAL STORAGE DEVICE

(71) Applicant: MITSUBISHI ELECTRIC CORPORATION, Chiyoda-ku (JP)

(72) Inventors: Makiko Kise, Chiyoda-ku (JP); Shinsuke Miki, Chiyoda-ku (JP); Shoji Yoshioka, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 281 days.

(21) Appl. No.: 14/650,932

(22) PCT Filed: Dec. 10, 2013

(86) PCT No.: PCT/JP2013/083107
§ 371 (c)(1),
(2) Date: Jun. 10, 2015

(87) PCT Pub. No.: WO2014/103705
PCT Pub. Date: Jul. 3, 2014

(65) Prior Publication Data
US 2015/0323611 A1 Nov. 12, 2015

(30) Foreign Application Priority Data
Dec. 26, 2012 (JP) .................................. 2012-282201

(51) Int. Cl.
*G01R 31/36* (2006.01)
*H01M 10/48* (2006.01)
(Continued)

(52) U.S. Cl.
CPC ..... *G01R 31/3651* (2013.01); *G01R 31/3679* (2013.01); *H01M 10/42* (2013.01); *H01M 10/48* (2013.01); *H02J 7/00* (2013.01)

(58) Field of Classification Search
CPC .......... G01R 31/3651; G01R 31/3679; H01M 10/42; H01M 10/04; H02J 7/00
See application file for complete search history.

(56) References Cited

U.S. PATENT DOCUMENTS 8,975,897 B2 * 3/2015 Yoshioka ........... G01R 31/3651
320/132
2008/0255783 A1 * 10/2008 Tamai .................. G01R 31/361
702/63
(Continued)

FOREIGN PATENT DOCUMENTS

JP 2007-271438 A 10/2007
JP 4147589 B2 7/2008
(Continued)

OTHER PUBLICATIONS

International Search Report dated Mar. 11, 2014, in PCT/JP2013/083107, filed Dec. 10, 2013.
(Continued)

*Primary Examiner* — Khamdan Alrobaie
(74) *Attorney, Agent, or Firm* — Oblon, McClelland, Maier & Neustadt, L.L.P.

(57) ABSTRACT

A life prediction apparatus for an electrical storage device, which has a life predictor, includes: an operation controller for life prediction that controls operation of the electrical storage device; a data collector that collects measurement data with respect to a plurality of operation conditions and calculates and successively accumulates evaluation characteristics; a data analyzer that creates a regression formula representing a relationship between the evaluation characteristic and an operation time by curve fitting, with an
(Continued)

appropriate approximation function, the accumulated evaluation characteristic data; and a life prediction formula creator that creates a life prediction formula for calculating a predicted value of the evaluation characteristic under random operation conditions on the basis of the regression formula.

9 Claims, 14 Drawing Sheets

(51) Int. Cl.
*H02J 7/00* (2006.01)
*H01M 10/42* (2006.01)

(56) References Cited

U.S. PATENT DOCUMENTS

| | | | |
|---|---|---|---|
| 2009/0070052 A1* | 3/2009 | Taniguchi | G01R 31/3651 702/63 |
| 2009/0112496 A1 | 4/2009 | Suzuki | |
| 2009/0189451 A1* | 7/2009 | Roepke | G06F 1/30 307/66 |
| 2010/0033132 A1* | 2/2010 | Nishi | B60K 6/365 320/136 |
| 2010/0312744 A1* | 12/2010 | Prokhorov | G01R 31/3679 706/52 |
| 2011/0288691 A1 | 11/2011 | Abe et al. | |
| 2012/0326726 A1* | 12/2012 | Tabuchi | G01R 31/3648 324/434 |
| 2013/0030739 A1* | 1/2013 | Takahashi | G01R 31/3658 702/63 |

FOREIGN PATENT DOCUMENTS

| | | |
|---|---|---|
| JP | 2009-112113 A | 5/2009 |
| JP | 2010-159661 A | 7/2010 |
| JP | 2011-220900 A | 11/2011 |

OTHER PUBLICATIONS

International Search Report issued Mar. 11, 2014, in PCT/JP2013/083107, filed Dec. 10, 2013.
Keiko Gunji, et al., "A Model for the Life Prediction of VRLA Batteries for Wind Power Output Stabilization", Shin-Kobe technical reports No. 22 (Mar. 2012), 8 pages.

* cited by examiner

| EVALUATION CHARACTERISTIC | FACTOR |
|---|---|
| DISCHARGE CAPACITY<br>INTERNAL RESISTANCE<br>AMOUNT OF LITHIUM IN ELECTRODE<br>AMOUNT OF GENERATED GAS<br>ELECTRODE THICKNESS<br>⋯⋯⋯ | TEMPERATURE<br>CHARGE FINAL VOLTAGE<br>DISCHARGE FINAL VOLTAGE<br>DISCHARGE CURRENT<br>CONSTANT-VOLTAGE HOLDING TIME<br>⋯⋯⋯ |

Fig. 3

| EVALUATION CHARACTERISTIC | FACTOR | LEVEL 1 | LEVEL 2 |
|---|---|---|---|
| DISCHARGE CAPACITY | TEMPERATURE | 5°C | 25°C |
| | CHARGE CURRENT | 700mA | 4620mA |
| | DISCHARGE CURRENT | 700mA | 2800mA |
| | CHARGE FINAL VOLTAGE | 3.9V | 4.1V |
| | DISCHARGE FINAL VOLTAGE | 2.5V | 3V |
| | CONSTANT-VOLTAGE HOLDING TIME | 0min | 210min |

Fig. 4

| No. | A | B | C | D | E | F |
|---|---|---|---|---|---|---|
| 1 | 1 | 1 | 1 | 1 | 1 | 1 |
| 2 | 1 | 1 | 1 | 1 | 1 | 2 |
| 3 | 1 | 1 | 2 | 2 | 2 | 1 |
| 4 | 1 | 2 | 1 | 2 | 2 | 1 |
| 5 | 1 | 2 | 2 | 1 | 2 | 2 |
| 6 | 1 | 2 | 2 | 2 | 1 | 2 |
| 7 | 2 | 1 | 2 | 2 | 1 | 1 |
| 8 | 2 | 1 | 2 | 1 | 2 | 2 |
| 9 | 2 | 1 | 1 | 2 | 2 | 2 |
| 10 | 2 | 2 | 2 | 1 | 1 | 1 |
| 11 | 2 | 2 | 1 | 2 | 1 | 2 |
| 12 | 2 | 2 | 1 | 1 | 2 | 1 |

Fig. 5

| OPERATION CONDITION | TEMPERA-TURE (°C) | CHARGE CURRENT (mA) | DISCHARGE CURRENT (mA) | CHARGE FINAL VOLTAGE (V) | DISCHARGE FINAL VOLTAGE (V) | CONSTANT-VOLTAGE HOLDING TIME (min) |
|---|---|---|---|---|---|---|
| 1 | 5 | 700 | 700 | 3.9 | 2.5 | 0 |
| 2 | 5 | 700 | 700 | 3.9 | 2.5 | 210 |
| 3 | 5 | 700 | 2800 | 4.1 | 3 | 0 |
| 4 | 5 | 4620 | 700 | 4.1 | 3 | 0 |
| 5 | 5 | 4620 | 2800 | 3.9 | 3 | 210 |
| 6 | 5 | 4620 | 2800 | 4.1 | 2.5 | 210 |
| 7 | 25 | 700 | 2800 | 4.1 | 2.5 | 0 |
| 8 | 25 | 700 | 2800 | 3.9 | 3 | 210 |
| 9 | 25 | 700 | 700 | 4.1 | 3 | 210 |
| 10 | 25 | 4620 | 2800 | 3.9 | 2.5 | 0 |
| 11 | 25 | 4620 | 700 | 4.1 | 2.5 | 210 |
| 12 | 25 | 4620 | 700 | 3.9 | 3 | 0 |

Fig. 6

| OPERATION CONDITION | REGRESSION FORMULA |
|---|---|
| 1 | $y = 1.004 - 1.38e^{-5}x$ |
| 2 | $y = 1.004 - 1.30e^{-5}x$ |
| 3 | $y = 0.995 - 3.97e^{-5}x$ |
| 4 | $y = 0.958 - 1.68e^{-3}x^{1/2}$ |
| 5 | $y = 1.000 - 1.33e^{-5}x$ |
| 6 | $y = 1.001 - 6.26e^{-5}x$ |
| 7 | $y = 1.004 - 6.33e^{-5}x + 1.46e^{-8}x^2 - 2.70e^{-12}x^3$ |
| 8 | $y = 0.999 - 1.83e^{-5}x$ |
| 9 | $y = 0.989 - 2.34e^{-5}x$ |
| 10 | $y = 0.977 - 5.51e^{-3}x^{1/2}$ |
| 11 | $y = 0.998 - 3.25e^{-6}x - 5.28e^{-8}x^2 + 1.84e^{-11}x^3 - 2.1e^{-15}x^4$ |
| 12 | $y = 0.993 - 2.71e^{-3}x^{1/2}$ |

Fig. 9

| OPERATION CONDITION | ESTIMATED CAPACITY RATIO | ACTUAL MEASURED CAPACITY RATIO | ERROR OF ESTIMATED VALUE (%) |
|---|---|---|---|
| 1 | 0.91 | 0.93 | 1.56 |
| 2 | 0.94 | 0.92 | 1.53 |
| 3 | 0.87 | 0.86 | 1.47 |
| 4 | 0.78 | 0.82 | 4.93 |
| 5 | 0.92 | 0.93 | 0.87 |
| 6 | 0.56 | 0.59 | 4.02 |
| 7 | 0.52 | 0.54 | 3.67 |
| 8 | 0.90 | 0.90 | 0.12 |
| 9 | 0.78 | 0.80 | 2.84 |
| 10 | 0.54 | 0.55 | 1.07 |
| 11 | 0.45 | 0.44 | 3.57 |
| 12 | 0.78 | 0.78 | 0.05 |

Fig. 10

| OPERATION CONDITION | ESTIMATED CAPACITY RATIO | ACTUAL MEASURED CAPACITY RATIO | ERROR OF ESTIMATED VALUE (%) |
|---|---|---|---|
| 1 | 0.88 | 0.93 | 4.27 |
| 2 | 0.96 | 0.92 | 4.24 |
| 3 | 0.83 | 0.86 | 3.07 |
| 4 | 0.77 | 0.82 | 5.27 |
| 5 | 0.84 | 0.93 | 9.09 |
| 6 | 0.66 | 0.59 | 7.42 |
| 7 | 0.63 | 0.54 | 8.95 |
| 8 | 0.88 | 0.90 | 1.38 |
| 9 | 0.89 | 0.80 | 8.96 |
| 10 | 0.56 | 0.55 | 0.71 |
| 11 | 0.65 | 0.44 | 21.24 |
| 12 | 0.74 | 0.78 | 4.01 |

Fig. 11

| OPERATION CONDITION | TEMPERA- TURE (°C) | CHARGE CURRENT (mA) | DISCHARGE CURRENT (mA) | CHARGE FINAL VOLTAGE (V) | DISCHARGE FINAL VOLTAGE (V) | CONSTANT- VOLTAGE HOLDING TIME (min) |
|---|---|---|---|---|---|---|
| 13 | 25 | 2380 | 1400 | 4 | 2.8 | 105 |
| 14 | 10 | 3500 | 2500 | 3.9 | 3.1 | 60 |
| 15 | 15 | 1200 | 1000 | 4.05 | 2.5 | 180 |

Fig. 12

| OPERATION CONDITION | ESTIMATED CAPACITY RATIO | ACTUAL MEASURED CAPACITY RATIO | ERROR OF ESTIMATED VALUE (%) |
|---|---|---|---|
| 13 | 0.68 | 0.70 | 2.86 |
| 14 | 0.95 | 0.95 | 0.40 |
| 15 | 0.69 | 0.71 | 2.47 |

Fig. 13

LIFE PREDICTION APPARATUS FOR ELECTRICAL STORAGE DEVICE AND LIFE PREDICTION METHOD FOR ELECTRICAL STORAGE DEVICE

TECHNICAL FIELD

The present invention relates to a life prediction apparatus for an electrical storage device and a life prediction method for an electrical storage device that can predict more accurately the life of the electrical storage device under random operation conditions by taking into account the type and operation conditions of the electrical storage device which affect the life of the electrical storage device.

BACKGROUND ART

Against the background of a low-carbon society, the types of electrical storage devices have diversified to include nickel-hydride batteries, lithium ion batteries, electric double layer capacitors, and the like. The application field of electrical storage devices has also expanded from the conventional portable devices to home appliances, backup power supplies, electric vehicles (EV), hybrid electric vehicles (HEV), and smart grids, and applications as large power supplies have demonstrated particularly significant expansion.

Electrical storage devices for use as large power supplies are more expensive and required to withstand longer use than the conventional power supplies for portable device. Therefore, it is also important from the standpoint of maintenance and inspection to predict more accurately the life of electrical storage devices.

However, the life of an electrical storage device is greatly affected by the material, structure and the like of the electrical storage device (referred to hereinbelow as "type of electrical storage device") and also temperature, charge/discharge final voltage and the like (referred to hereinbelow as "operation conditions of electrical storage device"). Therefore, it is important to predict the life of an electrical storage device by taking into account the type and operation conditions of the electrical storage device.

In the conventional method, the life of an electrical storage device is predicted by periodically discharging the electrical storage device during the use and performing diagnostics by comparing the pulsation amplitude of an output current and a terminal voltage with base data at the time of shipping (see, for example, Patent Literature 1).

In another conventional method, the relationship between the internal resistance of an electrical storage device and the elapsed time is measured at a plurality of points in time, an approximation formula for the relationship is created, and the time at which the internal resistance of the electrical storage device becomes equal to or greater than a predetermined internal resistance value is determined as the life of the electrical storage device (see, for example, Patent Literature 2).

In yet another conventional method, main factors affecting the life of an electrical storage device are extracted, the sensitivity of each factor is determined on the basis of a Taguchi method, which is a statistical method, and the life of the electrical storage device is predicted from the sensitivity (see, for example, Patent Literature 3).

CITATION LIST

Patent Literature

Patent Literature 1: Japanese Patent No. 4147589
Patent Literature 2: Japanese Patent Application Publication No. 2007-271438
Patent Literature 3: Japanese Patent Application Publication No. 2010-159661

SUMMARY OF INVENTION

Technical Problems

However, the following problems are associated with the conventional methods.

In Patent Literature 1, the life of an electrical storage device is predicted by performing diagnostics by comparing the pulsation amplitude of an output current and a terminal voltage with base data at the time of shipping. However, the pulsation amplitude of the terminal voltage of an electrical storage device is greatly affected by the state of charge (SOC) of a battery. Therefore, in order to measure accurately the pulsation amplitude of the terminal voltage of the electrical storage device, it is necessary to measure accurately the SOC of the electrical storage device.

Incidentally, a method for determining the SOC during charging and discharging from an open-circuit voltage is known. However, where the battery degrades and the chargeable-dischargeable capacity thereof decreases, the open-circuit voltage changes accordingly. Therefore, it is difficult to determine the SOC accurately. The resultant problem is that the life of the electrical storage device cannot be accurately predicted.

Further, in Patent Literature 2, the approximation formula of the relationship between the internal resistance of the electrical storage device and the elapsed time is created to predict the life of an electrical storage device. In this case, the internal resistance of the electrical storage device is greatly affected by the type and operation conditions of the electrical storage device.

However, the approximation formula in Patent Literature 2 does not take into account the effect produced by the type and operation conditions of the electrical storage device. Therefore, when the type and operation conditions of the electrical storage device at the time the approximation formula is created are different from those during the operation of the electrical storage device, the internal resistance does not necessarily increase as the electrical storage device is degraded, and in some cases, the internal resistance practically does not change. The resultant problem is that the life of the electrical storage device cannot be accurately predicted.

Further, in Patent Literature 3, it is assumed that the ratio of the present discharge capacity to the initial discharge capacity of the electrical storage device (abbreviated hereinbelow as "capacity ratio") is proportional to the operation time. However, the problem is that the proportional relationship is not always valid between the capacity ratio and operation time of the electrical storage device. Yet another problem is that the life of the electrical storage device cannot be predicted under operation conditions other than those implemented in advance.

The present invention has been created to resolve the above-described problems and it is an objective thereof to provide a life prediction apparatus for an electrical storage device and a life prediction method for an electrical storage device that can predict more accurately the life of the electrical storage device under random operation conditions by taking into account the type and operation conditions of the electrical storage device which affect the life of the electrical storage device.

Solution to Problems

A life prediction apparatus for an electrical storage device in accordance with the present invention comprises a life predictor that predicts a life of the electrical storage device, wherein the life predictor includes: an operation controller for life prediction that controls operation of the electrical storage device individually with respect to a plurality of different operation conditions on the basis of operation conditions that have been set in advance in relation to a plurality of factors affecting an evaluation characteristic which is to be used for calculating the life of the electrical storage device; a data collector that collects measurement data for each of the plurality of different operation conditions by performing operation control with the operation controller for life prediction by using the plurality of operation conditions, calculates the evaluation characteristic on the basis of the collected measurement data, and successively accumulates the calculated evaluation characteristics as time variation data in a storage device; a data analyzer that creates a regression formula representing a relationship between the evaluation characteristic and an operation time with respect to each of the plurality of operation conditions by curve fitting, with an appropriate approximation function, each of the time variation data relating to the evaluation characteristics and accumulated in the storage device by the data collector; and a life prediction formula creator that creates a life prediction formula for calculating a predicted value of the evaluation characteristic when operation conditions, which have been randomly set as the plurality of factors, are used, on the basis of the regression formula created by the data analyzer.

A life prediction method for an electrical storage device in accordance with the present invention is used in the life prediction apparatus for an electrical storage device in accordance with the present invention, wherein the life predictor executes: an operation control step for controlling operation of the electrical storage device individually with respect to a plurality of different operation conditions on the basis of operation conditions that have been set in advance in relation to a plurality of factors affecting an evaluation characteristic which is to be used for calculating the life of the electrical storage device; a data collection step for collecting measurement data for each of the plurality of different operation conditions by performing operation control in the operation control step by using the plurality of operation conditions, calculating the evaluation characteristic on the basis of the collected measurement data, and successively accumulating the calculated evaluation characteristics as time variation data in a storage device; a regression formula creation step for creating a regression formula representing a relationship between the evaluation characteristic and an operation time with respect to each of the plurality of operation conditions by curve fitting, with an appropriate approximation function, each of the time variation data relating to the evaluation characteristics and accumulated in the storage device in the data collection step; and a life prediction step for calculating a predicted value of the evaluation characteristic when operation conditions, which have been randomly set as the plurality of factors, are used, on the basis of the regression formula created in the regression formula creation step.

Advantageous Effects of Invention

In accordance with the present invention, the life prediction formula suitable for predicting, under random operation conditions, the evaluation characteristic which is to be used for calculating the life of an electrical storage device, is derived by statistical processing based on actually measured data obtained under a plurality of operation conditions which have been set in advance according to the type of the electrical storage device. As a result, it is possible to obtain a life prediction apparatus for an electrical storage device and a life prediction method for an electrical storage device that can predict more accurately the life of the electrical storage device under random operation conditions by taking into account the type and operation conditions of the electrical storage device which affect the life of the electrical storage device.

BRIEF DESCRIPTION OF DRAWINGS

FIG. 3 illustrates candidates for evaluation characteristics and factors in Embodiment 2 of the present invention.

FIG. 4 illustrates the evaluation characteristics, factors, and levels in Embodiment 2 of the present invention.

FIG. 5 is an L12 orthogonal array table of two levels which is used in an orthogonal array experiment.

FIG. 6 is an orthogonal array table in Embodiment 2 of the present invention.

FIG. 9 depicts the regression formula obtained by curve fitting the measurement data depicted in FIG. 8 in Embodiment 2 of the present invention.

FIG. 10 depicts the estimated value of the capacity ratio of the electrical storage device after 6000-h operation under the operation conditions depicted in FIG. 6 in Embodiment 2 of the present invention, and also depicts the error of the estimated value with respect to the actually measured value.

FIG. 11 depicts the estimated value of the capacity ratio of the electrical storage device after 6000-h operation under the operation conditions depicted in FIG. 6 (in the case in which the regression formula has been created by linear approximation) in Embodiment 2 of the present invention, and also depicts the error of the estimated value with respect to the actually measured value.

FIG. 12 illustrates specific set values relating to six factors as random operation conditions according to Embodiment 2 of the present invention.

FIG. 13 depicts the estimated value of the capacity ratio of the electrical storage device after 6000-h operation under the operation conditions depicted in FIG. 12 in Embodiment 2 of the present invention, and also depicts the error of the estimated value with respect to the actually measured value.

DESCRIPTION OF EMBODIMENTS

Figure 1:
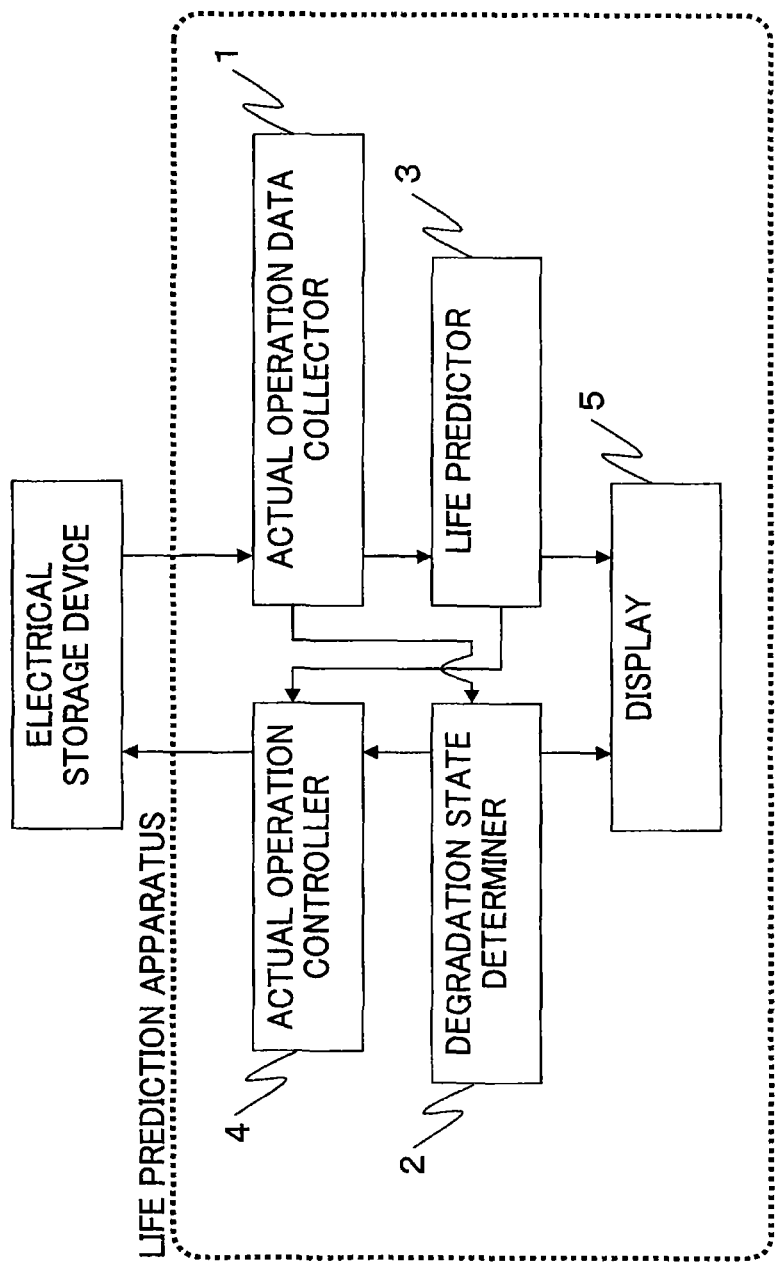
FIG. 1 is a configuration diagram of the life prediction apparatus for an electrical storage device according to Embodiment 1 of the present invention.

The preferred embodiments of the life prediction apparatus for an electrical storage device and the life prediction method for an electrical storage device in accordance with the present invention will be explained hereinbelow with reference to the drawings. In the drawings, the same or corresponding components are assigned with the same reference numerals.

Embodiment 1

FIG. 1 is a configuration diagram of the life prediction apparatus for an electrical storage device according to Embodiment 1 of the present invention. The life prediction apparatus for an electrical storage device which is depicted in FIG. 1 is constituted by an actual operation data collector 1, a degradation state determiner 2, a life predictor 3, an actual operation controller 4, and a display 5.

In the present invention, the electrical storage device depicted in FIG. 1 is the object of life prediction. In the explanation below, a cylindrical lithium ion battery is assumed as the electrical storage device, but the electrical storage device in accordance with the present invention is not limited to the cylindrical lithium battery.

For example, a storage battery such as a lead storage battery, a nickel-cadmium battery, a nickel-hydride battery, a sodium-sulfur battery, and a redox flow battery, and an electrical storage device such as an electric double layer capacitor can be used as the electrical storage device. Further, a primary battery may be used as the electrical storage device. Furthermore, the electrical storage device may be constituted by a plurality of primary/secondary batteries connected in series/parallel.

The actual operation data collector 1 corresponds to a cell monitoring unit (CMU) or a battery management unit (BMU). Thus, the actual operation data collector 1 measures data such as the temperature, current, and voltage of the electrical storage device during the operation control under certain operation conditions with a predetermined interval of time and outputs the measured data to the degradation state determiner 2 and the life predictor 3.

The degradation state determiner 2 determines the degradation state of the electrical storage device on the basis of the measurement data such as the temperature, current, and voltage of the electrical storage device which have been input from the actual operation data collector 1 under certain operation condition (referred to hereinbelow simply as "measurement data based on the operation conditions"). For example, the internal resistance of the electrical storage device is calculated from the current and voltage, and the electrical storage device degradation state is determined from the actual operation conditions and the internal resistance region which is the ratio of the calculated internal resistance to the initial internal resistance value. Alternatively, a discharge capacity is calculated by integrating the current, and the electrical storage device degradation state is determined by determining the capacity ratio which is the ratio of the calculated discharge capacity to the initial discharge capacity.

The life predictor 3 accumulates at all times the measurement data based on the operation conditions, which are output by the actual operation data collector 1, and predicts the life of the electrical storage device on the basis of the accumulated measurement data based on the operation conditions. Further, the measurement data based on the operation conditions can be also collected and accumulated in advance, thereby making it possible to predict the life of the electrical storage device under random operation conditions. A method by which the measurement data based on the operation conditions are collected in advance will be explained in greater detail in Embodiment 2.

The actual operation controller 4 inputs by feedback the calculation results obtained in the degradation state determiner 2 and the life predictor 3, and controls the operation of the electrical storage device such as to extend the life by optimizing the operation conditions such as current and voltage so as to maximize the predicted life value within the range under the usage conditions of the electrical storage device according to the degradation state of the electrical storage device.

The actual operation controller 4 is a controller having a function of controlling the operation of the electrical storage device. Further, the actual operation controller 4 is a function of all or part of xEMS (HEMS (Home Energy Management System), BEMS (Building Energy Management System), FEMS (Factory Energy Management System) and the like), which is an energy management system of electric power, gas and the like utilizing IT (Information Technology), CPU (Power Control Unit) of electric vehicles or hybrid electric vehicles, PCS (Power Control Subsystem) and PLC (Programmable Logic Controller) in the storage battery system.

Thus, the actual operation controller 4 controls the actual operation of the electrical storage device by using operation conditions suitable for actual operation and also determines the values of the plurality of factors that maximize the predicted life value within the range under the usage conditions of the electrical storage device on the basis of the measurement data collected during the actual operation and the life prediction formula, and updates the operation conditions. As a result, the actual operation controller 4 can realize the extended life of the electrical storage device by controlling the actual operation of the electrical storage device on the basis of the updated operation conditions.

The display 5 displays the degradation state of the electrical storage device and the life prediction value which are output by the degradation state determiner 2 and the life predictor 3. Further, the display 5 also has a function of displaying in real time the operation conditions and SOC of the electrical storage device.

As described hereinabove, according to Embodiment 1, by configuring the life prediction apparatus for an electrical storage device as depicted in FIG. 1, it is possible to predict the life of the electrical storage device on the basis of the accumulated measurement data based on the operation conditions, and also to obtain a life prediction apparatus for an electrical storage device and a life prediction method for an electrical storage device that can control the operation of the electrical storage device such as to extend the life thereof.

The life prediction apparatus according to Embodiment 1 of the present invention can be used in a grid-connected power storage system such as a wind power/photoelectric power generation system, a home power storage system for use in a smart house, backup power supplies, a vehicle such as an electric automobile, a hybrid electric automobile, an electric train, a bus, and industrial/construction machinery such as a harbor crane and a fork lifter.

Further, the effect of the life prediction apparatus according to Embodiment 1 of the present invention is better demonstrated in a system in which a large number of electrical storage devices are connected in series and parallel. For example, in a system configured by parallel connection of units each being configured by series connection of a plurality of electrical storage devices, it is possible to equalize the gradation among the units connected in parallel and suppress the degradation of the entire system by determining the degradation state of each unit with the degradation state determiner 2 and controlling input/output to/from each unit according to the result obtained. Thus, as a result of suppressing the input/output to/from a unit with a large degradation amount and increasing the input/output to/from a unit with a small degradation amount, the degradation of the unit with a large degradation amount is suppressed and the degradation of the unit with a small degradation amount is increased, thereby making it possible to suppress the degradation of the system as a whole.

Embodiment 2

Embodiment 2 of the present invention is a specific embodiment of the life predictor 3 in Embodiment 1 described hereinabove.

Figure 2:
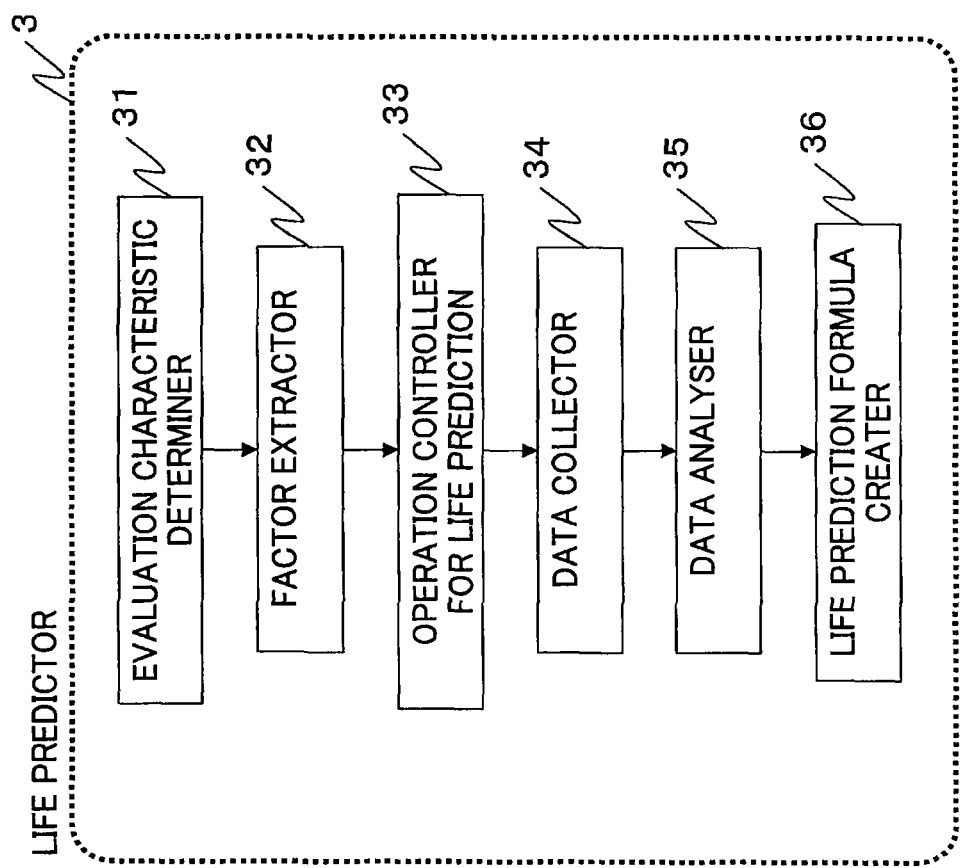
FIG. 2 is a configuration diagram of the life prediction apparatus for an electrical storage device according to Embodiment 2 of the present invention.

FIG. 2 is a configuration diagram of the life predictor 3 in the life prediction apparatus for an electrical storage device according to Embodiment 2 of the present invention. The life predictor 3 depicted in FIG. 2 is constituted by an evaluation characteristic determiner 31, a factor extractor 32, an operation controller 33 for life prediction, a data collector 34, a data analyzer 35, and a life prediction formula creator 36.

FIG. 3 illustrates candidates for evaluation characteristics and factors in Embodiment 2 of the present invention. The evaluation characteristic as referred to herein is an estimated physical amount to be used in calculating the life of the electrical storage device which is the life prediction object, and the factor is an operation condition affecting the evaluation characteristic. For example, the evaluation characteristics and factors depicted in FIG. 3 are used when predicting the life of various electrical storage devices.

Information on the evaluation characteristics suitable for each type of electrical storage devices which are the life prediction objects and the main factors affecting the evaluation characteristics is stored in advance in a storage device (not depicted in the figures) in the life predictor 3. The evaluation characteristic determiner 31 and the factor extractor 32 determine and extract the factors and evaluation characteristics, which are suitable for life prediction, with consideration for the type of the electrical storage device which is the life prediction object on the basis of the information which has been stored in advance.

FIG. 4 illustrates the evaluation characteristics, factors, and levels in Embodiment 2 of the present invention. FIG. 4 illustrates the evaluation characteristics, factors, and conditions (levels) for controlling the factors in the case in which a cylindrical lithium ion battery is used by way of example as the electrical storage device.

In FIG. 4, the "discharge capacity" is determined as the evaluation characteristic suitable for predicting the life of the cylindrical lithium ion battery from among the candidates of the evaluation characteristics depicted in FIG. 3. Further, a total of six factors, namely, "temperature", "charge current", "discharge current", "charge final voltage", "discharge final voltage", and "constant-voltage holding time (during charging)", are extracted as the factors affecting the "discharge capacity" from the candidates for the factors depicted in FIG. 3. Further, two levels are selected and two levels are set with respect to each of the six factors.

The operation controller 33 for life prediction controls the operation of the electrical storage device on the basis of operation conditions during life prediction on the basis of a plurality of combinations (corresponds to the below-described orthogonal array experiment) in which either one of the two levels is selected with respect to each of the six factors depicted in FIG. 4 during the collection of measurement data based on the operation conditions of the electrical storage device.

Considered hereinbelow is the process of collecting the measurement data based on operation conditions by changing the combinations of factors and levels depicted in FIG. 4 such as to enable the prediction of the life of the electrical storage device under random operation conditions. In such a case, an orthogonal array experiment is used as a tool for rapidly and efficiently determining the degree of the effect produced by the factors on the evaluation characteristics.

FIG. 5 is an L12 orthogonal array table of two levels which is used in an orthogonal array experiment. In Embodiment 2 of the present invention, the L12 orthogonal array table of two levels is used, but the orthogonal array table which is used in accordance with the present invention is not limited to the L12 orthogonal array table of two levels. The optimum table may be selected with consideration for the balance of the required measurement accuracy and the necessary number of measurement cycles. For example, an L9 or L27 orthogonal array table of three-level factors can be also used. The factors with different numbers of levels may be mixed in the orthogonal array table.

Where an orthogonal array experiment using the L12 orthogonal array table of six factors and two levels is used, by determining the evaluation characteristics from the measurement data under operation conditions 1 to 12 constituted by combinations of level 1 and level 2 of six factors A to F, as depicted in FIG. 5, it is possible to collect and accumulate efficiently the measurement data which are necessary for life prediction of the electrical storage device, without performing the measurements for all of 64 (=$2^6$) combinations.

FIG. 6 is an orthogonal array table in Embodiment 2 of the present invention. FIG. 6 is a table in which the evaluation characteristics, factors, and levels depicted in FIG. 4 are used in the L12 orthogonal array table with two levels which is depicted in FIG. 5. More specifically, the discharge capacity is used as the evaluation characteristic, and the temperature, charge current, discharge current, charge final voltage, discharge final voltage, and constant voltage retention time (during charging) are used as the factors A to F, respectively.

In Embodiment 2 of the present invention, the discharge capacity is used as the evaluation characteristic, but the evaluation characteristic which can be used in accordance with the present invention is not limited to the capacity ratio of the discharge capacity. Thus, physical parameters that change with time, such as depicted in FIG. 3, for example, the internal resistance and the amount of lithium in the electrode, can be also used. Further, a plurality of such evaluation characteristics may be selected and used in combination.

It is preferred that the evaluation characteristic used be normalized as a ratio to the initial value thereof, and the threshold of the ratio be taken as a life. Where a plurality of electrical storage devices are evaluated, the initial evaluation characteristic values before the operation is started varies among different individuals of the devices. Therefore, such an approach is effective for accurately evaluating the degradation amount in individual electrical storage devices.

The factors which can be used in accordance with the present invention are also not limited to the combinations presented in the orthogonal array table depicted in FIG. 6. Thus, other factors may be used, provided that they are main factors affecting the evaluation characteristics. When the factors which are to be stored in the storage device in the life predictor 3 are selected in advance, the factors are effectively extracted with a characteristic diagram or by a why-why analysis.

In the orthogonal array experiment, the operation controller 33 for life prediction performs operation control of the operation environment of the electrical storage device individually with respect to each of 12 operation conditions according to the orthogonal array table depicted in FIG. 6. At the same time, the data collector 34 collects and accumulates the measurement data based on the operation conditions and also accumulates the evaluation characteristics calculated from the measurement data, and the data analyzer 35 analyzes the measurement data and evaluation characteristics on the basis of the accumulated operation conditions.

Figure 7:
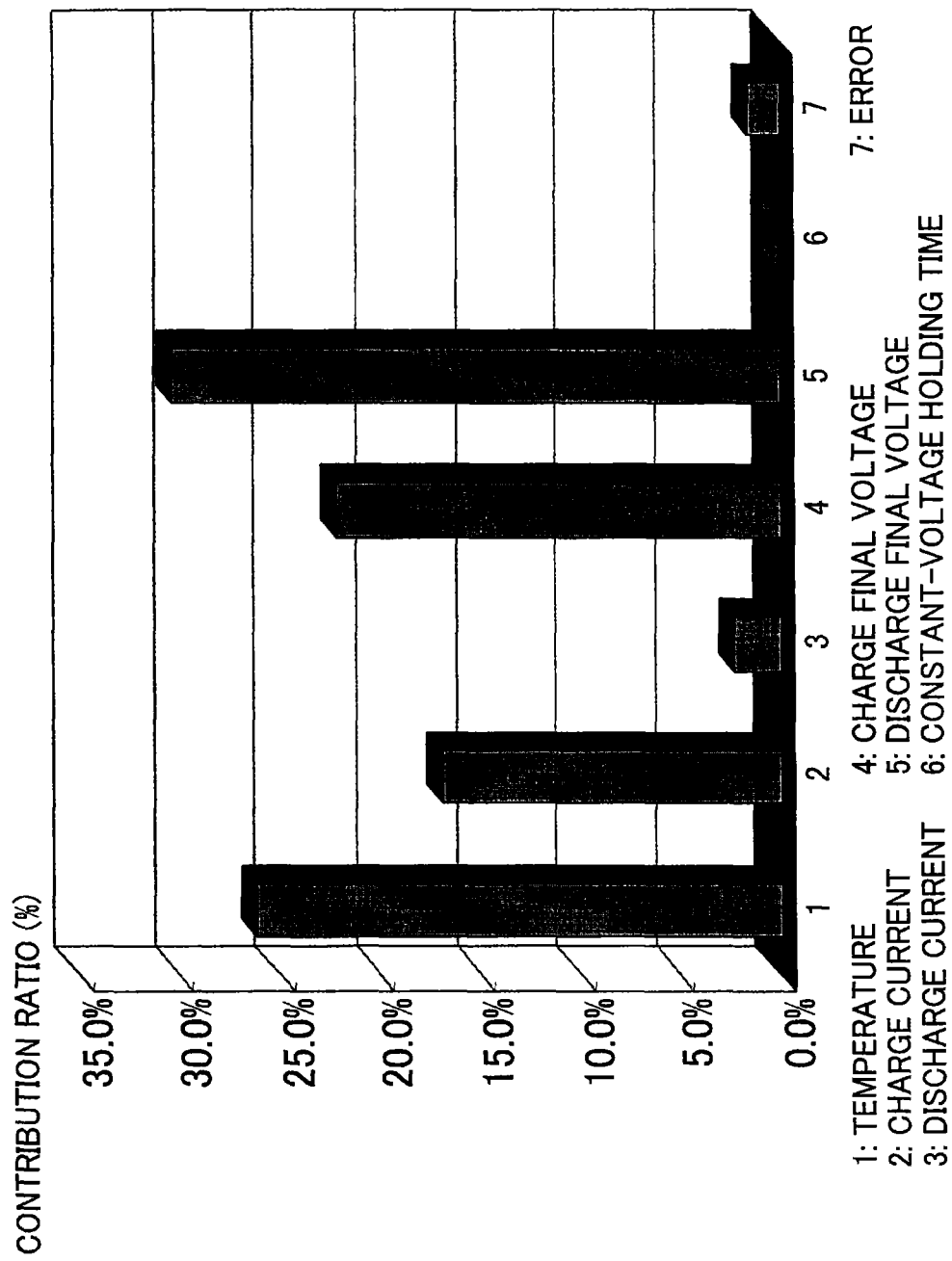
FIG. 7 depicts contribution ratios of various factors measured under the operation conditions depicted in FIG. 6 in Embodiment 2 of the present invention.

FIG. 7 depicts contribution ratios of various factors measured under the operation conditions depicted in FIG. 6 in Embodiment 2 of the present invention. In FIG. 7, the contribution ratios of various factors were calculated by implementing the dispersion analysis on the basis of the measurement data on the capacity ratio of the electrical storage device after 6000 operation cycles under each of 12 operation conditions depicted in FIG. 6. The contribution ratio of the factor, as referred to herein, is a value representing the relative strength of the effect produced by each factor on the evaluation characteristic, and this is a publicly known technique used in Patent Literature 3 and the like.

FIG. 7 indicates that the temperature, charge current, charge final voltage, and discharge final voltage are the factors producing a large effect on the evaluation characteristics. It is also clear that the constant voltage retention time, which has a contribution ratio less than an error, is a factor producing practically no effect on the evaluation characteristics.

The error in FIG. 7 includes the effect of interaction between the factors, and because the error is small, it is clear that in the orthogonal array table depicted in FIG. 6, the interaction between the factors is small. The interaction, as referred to herein, is the effect produced by a change in the level of a certain factor on another factor, and where the interaction is strong, a combination of interacting factors also should be added to the factors.

Thus, by investigating the contribution ratios and interaction of the factors by using the orthogonal array table, it is possible to verify the degree of effect produced by each extracted factor.

Figure 8:
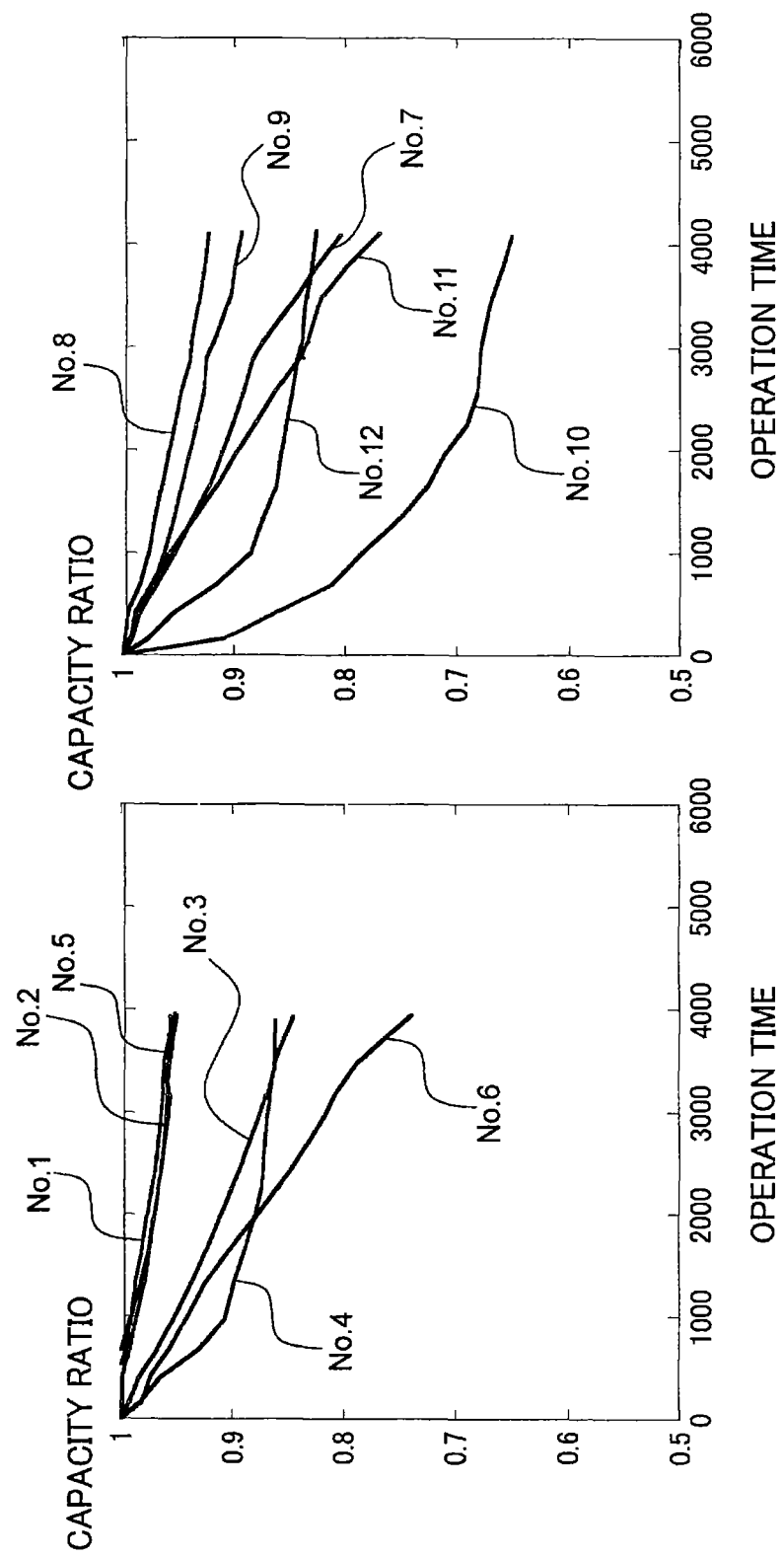
FIGS. 8A, 8B depict measurement data representing the relationship between the capacity ratio and operation time of the electrical storage device which is measured under the operation conditions depicted in FIG. 6 in Embodiment 2 of the present invention.

FIGS. 8A, 8B depict measurement data representing the relationship between the capacity ratio and operation time of the electrical storage device which is measured under the operation conditions depicted in FIG. 6 in Embodiment 2 of the present invention. As depicted in FIGS. 8A, 8B, the capacity ratio of the electrical storage device is greatly affected by the operation conditions. It is also clear that a proportional relationship is not always valid between the capacity ratio and operation time of the electrical storage device.

In FIGS. 8A, 8B, the operation time of the electrical storage device is plotted against the abscissa, but when it is desirable to predict the relationship between the life and the number of charge-discharge cycles, the number of charge-discharge cycles may be plotted against the abscissa.

FIG. 9 depicts the regression formula obtained by curve fitting the measurement data depicted in FIGS. 8A, 8B in Embodiment 2 of the present invention. The regression formulas $y_1$ to $y_{12}$ depicted in FIG. 9 are created by curve fitting the measurement data, which are based on the operation conditions among the operation conditions 1 to 12 depicted in FIGS. 8A, 8B, by using any one most appropriate approximation curve from among the following three approximation curves which have been specified in advance.

Operation conditions 1, 2, 3, 5, 6, 8, and 9

Linear approximation: $y_i = ax + b$

Operation conditions 7 and 11

Polynomial approximation: $y_i = ax^4 + bx^3 + cx^2 + dx + e$

Operation conditions 4, 10, and 12

Square root approximation: $y_i = ax^{1/2} + b$

The data analyzer 35 thus creates the regression formulas $y_1$ to $y_{12}$ by curve fitting, with an appropriate approximation function, the measurement data representing the relationship between the measured capacity ratio and the operation time of the electrical storage device.

Then, a statistical method is used to create a life prediction formula, which can predict the relationship between the capacity ratio and operation time of the electrical storage device even under general operation conditions other than the operation conditions of 12 types depicted in FIG. 6, by fitting into an approximation formula on the basis of the regression formulas $y_1$ to $y_{12}$ depicted in FIG. 9. An orthogonal polynomial (Chebyshev formula) represented by Expression (1) below can be used. Examples of the approximating orthogonal polynomial include a Laguerre polynomial, a Hermite polynomial, and a Jacobi polynomial in addition to the Chebyshev formula, but the Chebyshev formula enables highly accurate approximation when the influence of the main effect, such as battery degradation, is large, because low-order terms are preferential and the terms of various orders are independent from each other.

[Math. 1]

$$y = \bar{y} + a_1(A - \bar{A}) + a_2\left[(A - \bar{A})^2 - \frac{k^2-1}{12}h_A^2\right] + \\ b_1(B - \bar{B}) + b_2\left[(B - \bar{B})^2 - \frac{k^2-1}{12}h_B^2\right] + \ldots \quad (1)$$

y: evaluation characteristic;
$\bar{y}$: average value of evaluation characteristic;
$a_1, b_1 \ldots$ : coefficients determined from the evaluation characteristics;
A, B, . . . : levels;
$\bar{A}, \bar{B}, \ldots$ : average values of the levels;
k: number of levels;
$h_A, h_B \ldots$ : distance between the levels.

Where the number of levels is 2, Expression (1) hereinabove can be simplified into Expression (2) below.

[Math. 2]

$$y = \bar{y} + a_1(A - \bar{A}) + b_1(B - \bar{B}) + \ldots \quad (2)$$

In this case, the average value y(-) of the evaluation characteristic y, the average value A(-) of the level, and the coefficient $a_1$ can be represented by Expressions (3) to (5) below by using the regression formulas $y_1$ to $y_{12}$. Here, the symbol "(-)" means that a bar is placed on top of the letter preceding the parentheses ( ) and represents an average value.

[Math. 3]

$$\bar{y} = \frac{y_1 + y_2 + \ldots + y_{12}}{12} \quad (3)$$

$$\bar{A} = \frac{(a - h_A/2) + (a + h_A/2)}{2} \quad (4)$$

$$a_1 = \frac{A_2 - A_1}{h_A} \quad (5)$$

$$A_1 = \frac{y_1 + y_2 + y_3 + y_4 + y_5 + y_6}{6},$$

$$A_2 = \frac{y_7 + y_8 + y_9 + y_{10} + y_{11} + y_{12}}{6}$$

The life prediction formula creator 36 thus creates, on the basis of the regression formulas $y_1$ to $y_{12}$, the life prediction formulas such as represented by Expressions (2) to (5) above, which can be use used even under general operation conditions other than the operation conditions of 12 types depicted in FIG. 6.

More specifically, the life value y of the evaluation characteristic after 6000 h can be calculated by Expression (6) below by substituting the regression formula depicted in FIG. 9 and the values determined from Expressions (3) to (5) above into Expression (2).

$$y=5.720417-0.0083914 \times A-5.177127 \times 10^{-2} \times B- 3.662888 \times 10^{-2} \times C-0.858839 \times D+0.367459 \times E+ 1.070846 \times 10^{-4} \times F \quad (6)$$

FIG. 10 depicts the estimated value of the capacity ratio of the electrical storage device after 6000-h operation under the operation conditions depicted in FIG. 6 in Embodiment 2 of the present invention, and also depicts the error of the estimated value with respect to the actually measured value. The estimated value depicted in FIG. 10 is calculated by substituting the values of the factors under the operation conditions 1 to 12 depicted in FIG. 6 hereinabove into Expression (6) above, and the error of the estimated value is calculated using Expression (7) below.

[Math. 4]

Error of estimated value=[|(Actual capacity ratio)− (Estimated capacity ratio)|]/(Actual capacity ratio) (7)

As depicted in FIG. 10, the error of the estimated value is less than 5% under all of the operation conditions 1 to 12 depicted in FIG. 6, and it is clear that the life prediction formula of Expression (2) above can accurately estimate the capacity ratio of the electrical storage device after 6000-h operation.

Meanwhile, FIG. 11 depicts the estimated value of the capacity ratio of the electrical storage device after 6000-h operation under the operation conditions depicted in FIG. 6 (in the case in which the regression formula has been created by linear approximation) in Embodiment 2 of the present invention, and also depicts the error of the estimated value with respect to the actually measured value. The estimated value depicted in FIG. 11 was determined using Expression (6) above, and the error of the estimated value was determined using Expression (7) above.

As depicted in FIG. 11, it is clear that in the conventional method in which the regression formulas $y_1$ to $y_{12}$ are created by linear approximation, the error of the estimation value is larger than that in the method in accordance with the present invention in which the regression formulas $y_1$ to $y_{12}$ are created by curve fitting.

For example, the error of the estimated value under the operation condition 11 depicted in FIG. 6 is 3.57% in the case of curve fitting, but has a much larger value of 21.24% in the case of linear approximation. Thus, it is clear that creating the regression formulas $y_1$ to $y_{12}$ by curve fitting is effective for estimating the evaluation characteristic with a higher accuracy.

Moreover, by using Expression (2) above, it is possible to predict the life of the electrical storage device in addition to estimating the capacity ratio. For example, when the operation time in which the capacity ratio y of the electrical storage device becomes equal to or less than 0.5 is taken as the life of the electrical storage device, the operation time in which y in Expression (2) above becomes equal to or less than 0.5 may be determined by reverse calculations.

The present total operation time of the electrical storage device can be also estimated using Expression (2) above. For this purpose, initially, the present capacity ratio of the electrical storage device may be measured and the operation time in which the measured capacity ratio is obtained may then be determined by reverse calculations. Further, the remaining life of the electrical storage device can be calculated by calculating the difference between the life of the electrical storage device and the present total operation time of the electrical storage device.

Conditions relating to the factors that maximize the predicted life value within a range of usage conditions of the electrical storage device can be determined on the basis of the life prediction formula. For example, for conditions relating to the factors that maximize the life after 6000 h, the values of the factors may be determined such that the A to D reach minimum values and E and F reach maximum values in Expression (6).

Described hereinbelow are experimental results on the actually measured capacity ratio obtained when the electrical storage device has been actually used for 6000 h under three general operation conditions 13 to 15 which are different from the twelve operation conditions constituted by levels 1 and 2 in FIG. 6, and on the estimated capacity ratio determined using Expression (2) above. FIG. 12 illustrates specific set values relating to six factors as random operation conditions according to Embodiment 2 of the present invention. More generalized values, rather than those constituted by the combinations of level 1 and level 2 depicted in FIG. 4, are used as the values of the factors in those operation conditions 13 to 15.

Further, FIG. 13 depicts the estimated value of the capacity ratio of the electrical storage device after 6000-h operation under the operation conditions depicted in FIG. 12 in Embodiment 2 of the present invention, and also depicts the error of the estimated value with respect to the actually measured value. The estimated value depicted in FIG. 13 was determined using Expression (6) above, and the error of the estimated value was determined using Expression (7) above.

As depicted in FIG. 13, it is clear that the life prediction formula based on Expression (2) above can accurately estimate the capacity ratio of the electrical storage device after 6000-h operation also under all of the operation conditions 13 to 15.

As described hereinabove, according to Embodiment 2, the operation of the electrical storage device is controlled individually for a plurality of different operation conditions on the basis of the operation conditions which have been set in advance according to an orthogonal array table in relation to a plurality of factors affecting the evaluation characteristics which are to be used for calculating the life of the electrical storage device.

Further, the measurement data for each of a plurality of operation conditions are collected by performing operation control with the operation controller for life prediction by using a plurality of different conditions following the orthogonal array table, and the evaluation characteristics are calculated on the basis of the collected measurement data and successively accumulated as time variation data in the storage device.

Further, a regression formula representing the relationship between the evaluation characteristic and the operation time is then created with respect to each of the plurality of operation conditions, for which operation control has been performed according to the orthogonal array table, by curve fitting, with an appropriate approximation function, each of the time variation data relating to the evaluation characteristics and accumulated in the storage device by the data collector.

A life prediction formula for calculating the predicted value of the evaluation characteristic when operation conditions, which have been randomly set as the plurality of factors, are used is then created on the basis of the regression formula created by the data analyzer.

As a result, it is possible to obtain a life prediction apparatus for an electrical storage device and a life prediction method for an electrical storage device that can predict more accurately the life of the electrical storage device under random operation conditions by taking into account the type and operation conditions of the electrical storage device which affect the life of the electrical storage device, and that can perform operation control by changing the operation conditions such as to extend the life of the electrical storage device on the basis of the life prediction formula.

Further, by using the Chebyshev orthogonal polynomial as the approximation formula using the life prediction formula (2), it is possible to maintain orthogonality even with a plurality of factor levels and to predict more accurately the life of the electrical storage device under random operation conditions.

In Embodiment 2, two-level setting is performed with respect to six factors, but it is possible to consider separately the case in which charging-discharging is performed and the case in which it is not performed and predict the life by collecting measurement data based on various conditions by using orthogonal tables of two types with respect to one evaluation characteristic.

Thus, temperature and storage SOC are considered as factors of the orthogonal table when no charging or discharging is performed, and factors excluding, for example, the constant voltage holding time, which is the time factor in FIG. 4, are set as factors of the orthogonal table when charging and discharging are performed.

The operation is performed on the basis of the orthogonal tables, and the degradation amount when no charging or discharging is performed (storage degradation amount) and the degradation amount when charging and discharging are performed (charge and discharge degradation amount) are determined on the basis of the life prediction formula.

Highly accurate life prediction can be performed by calculating the total degradation amount in a certain fixed period of time by integrating the storage degradation amount and the charge and discharge degradation amount over a combination of the time in which charging and discharging are performed and a stop time.

Embodiment 3

In the case explained in Embodiment 3 of the present invention, the life prediction for random operation conditions is implemented offline, without the function of controlling the operation of the electrical storage device, by using the life prediction formula created on the basis of the accumulated measurement data which are based on the operation conditions in Embodiment 2.

Figure 14:
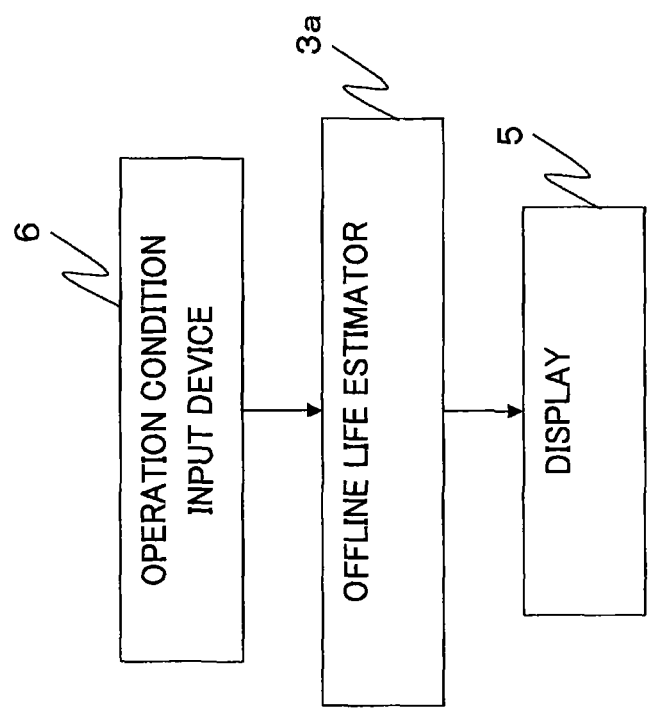
FIG. 14 is a configuration diagram of the life prediction apparatus for an electrical storage device according to Embodiment 3 of the present invention.

FIG. 14 is a configuration diagram of the life prediction apparatus for an electrical storage device according to Embodiment 3 of the present invention. The life prediction apparatus depicted in FIG. 14 is constituted by an offline life predictor 3a, a display 5, and an operation condition input device 6.

In the life prediction apparatus for an electrical storage device depicted in FIG. 14, life prediction with respect to operation conditions can be implemented offline by setting a pre-calculated life prediction formula, without the function of controlling the operation of the electrical storage device, after implementing the calculation processing of the life prediction formula such as described in Embodiment 2. Therefore, the life prediction apparatus for an electrical storage device depicted in FIG. 14 is constituted by a minimum number of constituent elements necessary for life prediction of the electrical storage device, without using the constituent elements for operating the electrical storage device.

More specifically, the life prediction apparatus for an electrical storage device depicted in FIG. 14 is provided only with the offline life predictor 3a and the display 5, from among the constituent elements of the life prediction apparatus for an electrical storage device depicted in FIG. 1, and also includes the operation condition input device 6 for inputting the operation time, type, and operation conditions of the electrical storage device which is the measurement object. In the offline life predictor 3a, the life prediction formula is created in advance, and the operation condition input device 6 inputs the operation time, type, and operation conditions of the electrical storage device which is the measurement object. As a result, the life of the electrical storage device corresponding to the input contents is predicted and displayed on the display 5.

For example, when the capacity ratio is used as the evaluation characteristic, the offline life predictor 3a determines the time in which the capacity ratio of the electrical storage device becomes equal to or less than a predetermined capacity ratio by using the life prediction formula and displays this time as the life of the electrical storage device on the display 5. Alternatively, the remaining life of the electrical storage device can be also displayed by determining the difference between the life of the electrical storage device and the operation time of the electrical storage device. Furthermore, the optimum operation conditions can be displayed by inputting the set life.

As described hereinabove, according to Embodiment 3, it is possible to provide a life prediction apparatus for an electrical storage device and a life prediction method for an electrical storage device that can be implemented offline the life prediction with respect to random operation conditions by setting the pre-calculated life prediction formula, without the function of controlling the operation of the electrical storage device.

When the operation conditions are updated within the operation period, the degradation caused by the updated operation conditions can be predicted by determining the degradation state prior to the updating on the basis of the data, such as temperature, voltage, and current, collected by the actual operation data collector 1.

The invention claimed is:

1. A life prediction apparatus for an electrical storage device, comprising:
   an actual operation controller that controls operation of the electrical storage device;
   an actual operation data collector that collects measurement data on the electrical storage device which is being operated;
   a degradation state determiner that determines a degradation state of the electrical storage device on the basis of the measurement data collected by the actual operation data collector; and
   a life predictor that predicts a life of the electrical storage device, wherein
   the life predictor includes
      an operation controller for life prediction that controls operation of the electrical storage device individually with respect to a plurality of different operation conditions on the basis of operation conditions that have been set in advance in relation to a plurality of factors affecting an evaluation characteristic which is to be used for calculating the life of the electrical storage device,
      a data collector that collects measurement data for each of the plurality of different operation conditions by performing operation control with the operation controller for life prediction by using the plurality of operation conditions, calculates the evaluation characteristic on the basis of the collected measurement data, and successively accumulates the calculated evaluation characteristics as time variation data in a storage device,
      a data analyzer that creates a regression formula representing a relationship between the evaluation characteristic and an operation time with respect to each of the plurality of operation conditions by curve fitting, with an approximation function, each of the time variation data relating to the evaluation characteristics and accumulated in the storage device by the data collector, and
      a life prediction formula creator that creates a life prediction formula for calculating a predicted value of the evaluation characteristic when operation conditions, which have been randomly set as the plurality of factors, are used, on the basis of the regression formula created by the data analyzer, wherein
   the operation controller for life prediction uses, as the plurality of operation conditions, operation conditions which have been set with respect to the plurality of factors on the basis of an orthogonal array table, and controls the operation of the electrical storage device to extend the life of the electrical storage device, and
   the life prediction formula creator creates the life prediction formula by fitting into an approximation formula, on the basis of a plurality of the regression formulas created on the basis of the plurality of operation conditions for which operation control has been performed according to the orthogonal array table.

2. The life prediction apparatus for an electrical storage device according to claim 1, wherein
   the approximation formula is a Chebyshev orthogonal polynomial.

3. The life prediction apparatus for an electrical storage device according to claim 1, wherein
   the life prediction formula creator creates the life prediction formulas by setting factors for a storage degradation which does not follow charging and discharging and for a charge-discharge degradation which follows charging and discharging, as the plurality of operation conditions, and creates one life prediction formula by combining the life prediction formulas according to an operation pattern.

4. The life prediction apparatus for an electrical storage device according to claim 1, wherein
   the actual operation controller updates the operation conditions by determining values of a plurality of factors at which the predicted life value is maximized within a range of usage conditions of the electrical storage device on the basis of measurement data collected during the actual operation and the life prediction formula, and controls the actual operation of the electrical storage device on the basis of the updated operation conditions.

5. A life prediction method for an electrical storage device, which is used in the life prediction apparatus for an electrical storage device according to claim 1, wherein
   the life predictor executes:
   an operation control step for controlling operation of the electrical storage device individually with respect to a plurality of different operation conditions on the basis of operation conditions that have been set in advance in relation to a plurality of factors affecting an evaluation characteristic which is to be used for calculating the life of the electrical storage device;
   a data collection step for collecting measurement data for each of the plurality of different operation conditions by performing operation control in the operation control step by using the plurality of operation conditions, calculating the evaluation characteristic on the basis of the collected measurement data, and successively accumulating the calculated evaluation characteristics as time variation data in a storage device;
   a regression formula creation step for creating a regression formula representing a relationship between the evaluation characteristic and an operation time with respect to each of the plurality of operation conditions by curve fitting, with an approximation function, each of the time variation data relating to the evaluation characteristics and accumulated in the storage device in the data collection step; and
   a life prediction step for calculating a predicted value of the evaluation characteristic when operation conditions, which have been randomly set as the plurality of factors, are used, on the basis of the regression formula created in the regression formula creation step, wherein
   the operation control step uses, as the plurality of operation conditions, operation conditions which have been set with respect to the plurality of factors on the basis of an orthogonal array table, and controls the operation of the electrical storage device; and
   the life prediction step creates the life prediction formula by fitting into an approximation formula as an orthogonal polynomial, on the basis of a plurality of the regression formulas created on the basis of the plurality of operation conditions for which operation control has been performed according to the orthogonal array table.

6. The life prediction apparatus for an electrical storage device according to claim 1, wherein
the evaluation characteristic is an internal resistance of the electrical storage device.

7. The life prediction apparatus for an electrical storage device according to claim 1, wherein
the evaluation characteristic is an amount of lithium in an electrode of the electrical storage device.

8. The life prediction apparatus for an electrical storage device according to claim 1, wherein
the evaluation characteristic is an amount of gas generated by the electrical storage device.

9. The life prediction apparatus for an electrical storage device according to claim 1, wherein
the evaluation characteristic is an electrode thickness in the electrical storage device.

\* \* \* \* \*